United States Patent [19]
Ye et al.

[11] Patent Number: 6,071,372
[45] Date of Patent: Jun. 6, 2000

[54] RF PLASMA ETCH REACTOR WITH INTERNAL INDUCTIVE COIL ANTENNA AND ELECTRICALLY CONDUCTIVE CHAMBER WALLS

[75] Inventors: Yan Ye, San Jose; Donald Olgado, Palo Alto; Avi Tepman, Cupertino; Diana Ma, Saratoga; Gerald Yin, Cupertino; Peter Loewenhardt, San Jose; Jeng H. Hwang, Cupertino; Steve Mak, Pleasanton, all of Calif.

[73] Assignee: Applied Materials, Inc., Santa Clara, Calif.

[21] Appl. No.: 08/869,798

[22] Filed: Jun. 5, 1997

[51] Int. Cl.$^7$ .............................. C23F 1/02; C23C 16/00
[52] U.S. Cl. ........................................ 156/345; 118/723 I
[58] Field of Search ........................... 118/723 I, 723 IR, 118/723 AN; 156/345; 204/298.06, 298.34; 315/111.51

[56] References Cited

U.S. PATENT DOCUMENTS

| | | |
|---|---|---|
| 4,865,712 | 9/1989 | Mintz . |
| 5,175,608 | 12/1992 | Nihei et al. . |
| 5,178,739 | 1/1993 | Barnes et al. . |

(List continued on next page.)

FOREIGN PATENT DOCUMENTS

| | | |
|---|---|---|
| 030408 | 8/1986 | Japan . |

OTHER PUBLICATIONS

Yamashita, M. "Fundamental characteristics of built–in high–frequency coil–type sputtering apparatus", J. Vac. Sci. Technology A, vol. 7, No. 2, Mar./Apr. 1989, pp. 151–158.

Rossnagel, S.M. and Hopwood, J. "Metal ion deposition from ionized magnetron sputtering discharge", J. Vac. Sic. Technology B, vol. 12, No. 1, Jan./Feb. 1994, pp. 449–453.

Rossnagel, S.M., Hopwood, J. "Magnetron sputter deposition with high levels of metal ionization", Appl. Phys. Lett., vol. 63, No. 24, Dec. 13, 1993, pp. 3285–3287.

Rossnagel, S.M. "Ionized Magnetron Sputtering for Lining and Filling Trenches and Vias", Semiconductor International, Feb. 1996, pp. 99–102.

Rossnagel, S.M. "Directional and Ionized Sputter Deposition for Microelectrons Applications", J. Appl. Phys., vol. 78, No. 2, Jul. 15, 1995, pp. 253–260.

Qian, F., Hopwood, J. "Mechanisms for highly ionized magnetron sputtering", J. App. Phys. 78(2), Jul. 15, 1995, pp. 758–765.

*Primary Examiner*—Thi Dang
*Assistant Examiner*—Luz Alejandro
*Attorney, Agent, or Firm*—Michaelson and Wallace

[57] ABSTRACT

An RF plasma etch reactor having an etch chamber with electrically conductive walls and a protective layer forming the portion of the walls facing the interior of the chamber. The protective layer prevents sputtering of material from the chamber walls by a plasma formed within the chamber. The etch reactor also has an inductive coil antenna disposed within the etch chamber which is used to generate the plasma by inductive coupling. Like the chamber walls, the inductive coil antenna is constructed to prevent sputtering of the material making up the antenna by the plasma. The coil antenna can take on any configuration (e.g. location, shape, orientation) that is necessary to achieve a desired power deposition pattern within the chamber. Examples of potential coil antenna configurations for achieving the desired power deposition pattern include constructing the coil antenna with a unitary or a segmented structure. The segmented structure involves the use of at least two coil segments wherein each segment is electrically isolated from the other segments and connected to a separate RF power signal. The unitary coil antenna or each of the coil segments can have a planar shape, a cylindrical shape, a truncated conical shape, a dome shape, or any combination thereof. The conductive walls are electrically grounded to serve as an electrical ground (i.e. anode) for a workpiece-supporting pedestal which is connected to a source of RF power to create a bias voltage at the surface of the workpiece.

49 Claims, 7 Drawing Sheets

U.S. PATENT DOCUMENTS

| | | | |
|---|---|---|---|
| 5,531,834 | 7/1996 | Ishizuka et al. | 118/723 I |
| 5,683,537 | 11/1997 | Ishii | 156/345 |
| 5,716,451 | 2/1998 | Hama et al. | 118/723 |
| 5,763,851 | 6/1998 | Forster et al. | 219/121.43 |
| 5,891,252 | 4/1999 | Yokogawa et al. | 118/723 AN |
| 5,897,713 | 4/1999 | Tomioka et al. | 118/723 I |

(PRIOR ART)

RF PLASMA ETCH REACTOR WITH INTERNAL INDUCTIVE COIL ANTENNA AND ELECTRICALLY CONDUCTIVE CHAMBER WALLS

BACKGROUND OF THE INVENTION

1. Technical Field

The invention relates to an RF plasma etch reactor, and more particularly to such a reactor employing an internal inductive coil antenna and electrically conductive chamber walls.

2. Background Art

Figure 1:
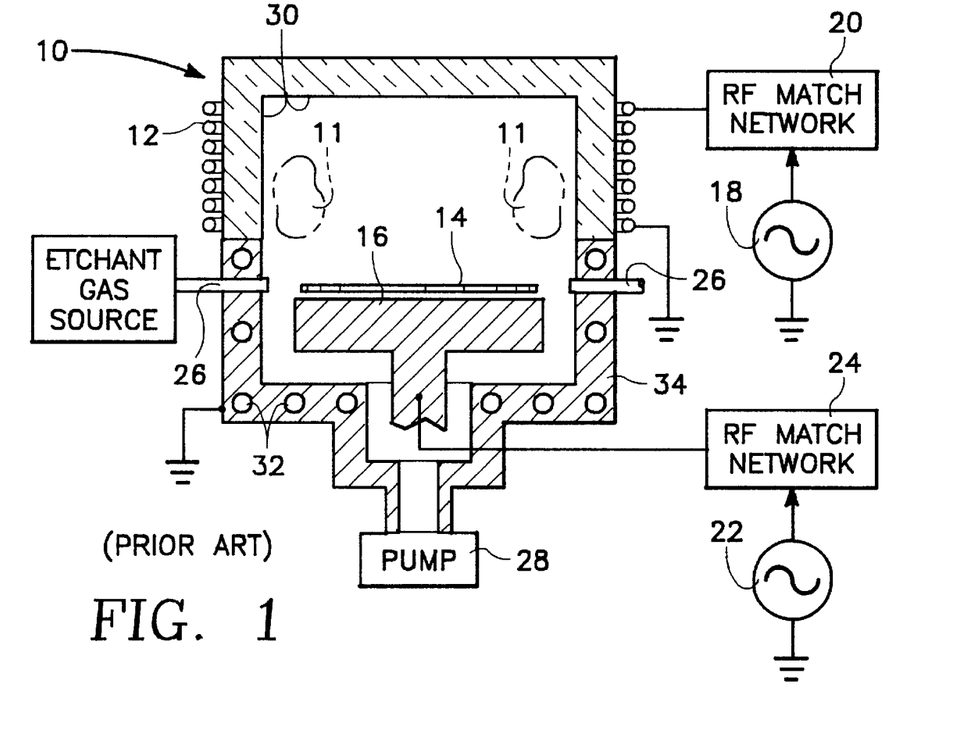
FIG. 1 is a cross-sectional view of a conventional inductively coupled RF plasma etch reactor with a cylindrical chamber.

A typical inductively coupled plasma etch reactor of the type currently available is depicted in FIG. 1. This reactor has a vacuum chamber 10 surrounded by an inductive coil 12. A workpiece 14, usually a semiconductor wafer, is supported inside the chamber 10 on a pedestal 16. An inductive coil antenna 12 is wound around the outside of the chamber 10 and connected to a radio frequency (RF) power generator 18 through an impedance matching network 20 to provide RF power into the chamber. In addition, a bias RF power generator 22 and associated impedance matching circuit 24 is connected to the pedestal 16 and used to impose a bias on the workpiece 14. The chamber walls 30 are composed of an electrically insulating material, typically quartz or ceramic, so as to minimize attenuation of the RF power coupled into the chamber 10. Underlying the insulative chamber walls 30 and surrounding the pedestal 16 is an portion 34 of the chamber constructed of a conductive material. This conductive portion 34 is electrically grounded and serves as the ground for the RF power supplied to the pedestal 16. There are also cooling channels 32 formed within the conductive portion 34. Coolant fluid is pumped through the channels 32 to transfer heat away from the interior of the chamber 10 so that the chamber temperature can be maintained at a particular level desired for the etch process being performed. The exterior of the chamber walls 30 are also cooled for the same reason. However, as insulative materials such as quartz and ceramic cannot be easily formed with internal cooling channels, the exterior surface of the walls 30 are cooled, typically by forced air convection methods. Etchant gas is introduced into the chamber 10 through gas injection ports 26. A vacuum pump 28 evacuates the chamber 10 to a desired chamber pressure.

In operation, an etchant gas is introduced into the interior of the chamber 10 and RF power inductively coupled from the coil 12 generates a plasma within the chamber. The plasma produces etchant species (e.g. ions and radicals) from the etchant gas which are used to etch the workpiece 14. A key component of anisotropic etching processes is the bombardment of the workpiece 14 with ions produced in the plasma. The energy and directionality exhibited by the ions and their density within the plasma are important factors which, to a large part, determine the quality of the resulting etched workpiece 14. These factors substantially determine etch uniformity, etch rate, photoresist selectivity, the straightness of the etch profile, and the smoothness of etch feature sidewalls. For example, a high plasma ion energy at the surface of the workpiece 14 is desirable so as to prevent isotropic etching and to maximize the etching rate. However, ion energy which is too high will produce poor etching results, such as high photoresist loss, and can cause damage to the devices being formed on the workpiece 14. Therefore, the plasma ion energy is ideally kept relatively near but below a threshold at which the etch quality begins to deteriorate significantly and/or where device damage becomes unacceptable. Similarly, a high plasma ion density is desirable so as to maintain a high etch rate. Essentially, the more ions there are, regardless of their energy, the faster the workpiece 14 is etched.

In the inductively coupled reactor of FIG. 1, the plasma ion density is substantially controlled by the amount of RF power coupled into the chamber via the coil 12. For the most part, the more power coupled, the higher the plasma ion density. Thus, in most cases, the plasma ion density can be held to a desired level by selecting the appropriate amount of RF power to be supplied by the RF power generator 18 to the coil 12. The RF power coupled into the chamber by the coil 12, however, does not significantly affect the plasma ion energy at the surface of the workpiece 14. Control of the ion energy at the surface of the workpiece is conventionally accomplished by capacitively coupling RF power into the chamber via the to the pedestal 16 using the bias RF power generator 22. Ideally, the bias power supplied to the pedestal 16 will not significantly affect the ion density produced in the chamber 10, thereby decoupling the control of ion density and ion energy.

The plasma ion energy controlled by the bias RF power applied to the pedestal 16 is, however, affected by the ratio of the surface area of the pedestal to the surface area of the grounded portion 34 of the chamber. The pedestal 16 acts as the cathode and the grounded portion 34 serves as the anode to form a capacitively coupled circuit. Since the majority of the interior surface of the chamber 10 is formed by the insulative chamber walls 30 to maximize the inductive coupling of power into the chamber from the coil 12, the surface area associated with the grounded portion 34 is necessarily limited, and typically not too much larger than that of the pedestal 16. An ion energy control problem results because the surface areas of the grounded portion 34 and the pedestal 16 are too close in size in a conventional inductively coupled etch reactor. When the surface area of the pedestal 16 is less than that of the grounded portion 34, the average voltage (often referred to as the DC bias voltage) at the surface of the workpiece 14 is negative. This average negative voltage is employed to draw the positively charged ions from the plasma to the workpiece 14. However, if the surface area of the pedestal 16 is only slightly smaller than the surface area of the grounded portion (as is typically the case in a conventional inductively coupled plasma etch reactor), the average negative voltage at the surface of the workpiece 14 is relatively small. This small bias voltage results in a weak attracting force and so a relatively low average ion energy. A higher negative bias voltage value than can typically be obtained using a conventional inductively coupled plasma etch reactor is necessary to optimize the plasma ion energy so as to ensure the maximum etch rate and no significant damage to the devices being formed on the workpiece 14. Ideally, the surface area of the grounded portion 34 would be sufficiently large in comparison with that of the pedestal 16 so as to produce the maximum possible negative average voltage at the surface of the workpiece 14, i.e. one half the peak to peak voltage.

The previously-described inductively coupled etch reactor has in the past been used to etch aluminum from the surface of the workpiece 14. This etching process produced byproducts comprising mostly aluminum chlorides ($AlCl_x$) and fragments of photoresist which tend to deposit on the walls of the reactor chamber 10. The byproducts of an aluminum etch have no significant effect on the plasma characteristics (e.g. plasma ion density and energy) because they are almost totally non-conductive. However, it is also desirable to etch other metals from the surface of a workpiece 14, such as copper (Cu), platinum (Pt), tantalum (Ta), rhodium (Rh), and titanium (Ti), among others. Etching these metals presents a problem when using the conventional etch reactor of FIG. 1 because the etching by-products of these metals tend to be conductive. Thus, a conductive coating forms on the chamber walls. This conductive coating has the effect of attenuating the RF power coupled into the chamber by the coil 12. The coil 12 produces a magnetic field which results in power being coupled into the chamber. When the interior surface of the chamber under the coil 12 is coated with a conductive material, eddy currents are produced in this material, thereby attenuating the magnetic field to some extent and reducing the amount of power coupled into the interior of the chamber 10. As the conductive coating builds in thickness over successive etch processes, the attenuation progressively increases and the power coupling into the plasma progressively decreases. It has been found that a 10 to 20 percent decrease in power coupled into the plasma occurs after processing 100 workpieces. In addition, the conductive coating can electrically couple to the grounded anode portion 34 of the chamber, thereby effectively increasing the anode area. This increase in anode area in turn tends to increase the previously mentioned negative DC bias voltage. The change in the bias voltage due to the altered effective anode area results in an unexpected increase in the capacitive coupling of RF power from the pedestal.

The progressive reduction of inductively coupled RF power and increase in capacitively coupled RF power have detrimental effects on the etching process. For example, the plasma ion density is lowered due to the decrease in inductively coupled RF power and the plasma ion energy is increased due to the increase in capacitively coupled power. As the RF power levels are typically set prior to the etching process to optimize plasma ion density and energy, any change could have an undesirable impact on etch quality. The changes in power coupling caused by conductive etch by-products coating the chamber 10 also affect other etch process parameters and plasma characteristics, as well. For instance, the photoresist selectivity is lowered, etch stop depths are reduced, and ion current/energy distribution and the etch rate are adversely affected. These changed parameters and characteristics result in different, and often unacceptable workpiece etch characteristics (such as poor photoresist selectivity, poor etch rate uniformity or etch rate shift, and device damage). It has been found that even after only two or three workpieces 14 have been etched, unwanted changes in the etch profile can be observed. In addition to the detrimental effects on the etch process parameters and plasma characteristics, it has also been found that the reduced inductive coupling of RF power into the chamber 10 causes problems with igniting and maintaining a plasma.

Of course, the decrease in inductively coupled power could be compensated for by increasing the RF power supplied to the coil 12. Similarly, the increase in capacitively coupled power can be compensated for by decreasing the RF power supplied to the pedestal 16. In addition, the chamber walls can be cleaned more often than would typically be necessary when etching materials producing non-conductive by-products such as aluminum. However, these types of work-arounds are generally impractical. A user of an etch reactor typically prefers to set the respective RF power levels in accordance with a so-called "recipe" supplied by the reactor's manufacturer. Having to deviate from the recipe to compensate for the conductive deposits would be unacceptable to most users. Further, it is believed that the aforementioned detrimental effects will be unpredictable, and therefore, the required changes in the RF power settings needed to compensate could not be predetermined. Thus, unless the user employs some form of monitoring scheme, the required compensating changes in RF power input would be all but impossible for a user to implement. Realistically, the only viable solution would be to clean the chamber frequently, perhaps as often as after the completion of each etch operation. However, this increase in the frequency of cleaning (for example, over that necessary when etching aluminum) would be unacceptable to most users as it would lower throughput rates and increase costs significantly.

Another drawback associated with a conventional inductively coupled etch reactor, such as the one depicted in FIG. 1, is that the structure places limitations on power deposition and etchant species diffusion within the chamber 10. Power deposition in an etch reactor's chamber 10 concerns the distribution of power within the chamber's interior. For example, the regions 11 designated by dashed lines in FIG. 1, exhibit a high level of power deposition owing to their proximity to the coil 12. Whereas, the power deposition away from these regions 11, such as near the workpiece 14, is much lower. However, in many applications, it is desirable that the region of the chamber immediately adjacent the exposed surface of the workpiece 14 exhibit a high power deposition. For example, a high power deposition near the exposed surface of the workpiece 14 may be advantageously used to create a high plasma ion density in that region. Granted, the shape of the chamber might be changed to move the coil 12, and so the region of high power deposition, nearer to the workpiece 14. A variety of chamber shapes are known. For example, dome-shaped chambers are sometimes employed wherein the coil wraps around the outside also forming a dome shape. However, there are limits to how the chamber can be shaped in an attempt to bring the regions of high power deposition to the most advantageous location in relation to the workpiece. These limits derive from the fact that the shape of the chamber also has a significant impact on the characteristics of the plasma and the etch processing parameters associated therewith. Thus, a compromise must be struck between the shape of the chamber and the desired power deposition pattern therein. Typically, this precludes optimizing the power deposition within the chamber.

The other factor mentioned above is etchant species diffusion. This term refers to the tendency for etchant species to migrate from areas of high concentrations, such as a region having a high power deposition where they tend to be formed in great quantities, to areas of lower concentrations. The diffusion patterns are dependent upon the particular type of etchant species involved, and can vary significantly from one to another. Thus, it is possible to influence the make-up of the plasma adjacent the exposed surface of the workpiece 14 by tailoring the power deposition profile in the chamber to take advantage of the diffusion characteristics of the etchant species formed in the plasma. Consequently, it is still feasible to have regions 11 of high power deposition remote from the exposed surface of the workpiece 14, while creating the desired plasma characteristics in the region adjacent this surface. However, a problem arises when the particular species that is desired to be diffused to the region adjacent the workpiece 14 is of a type having a relatively short life span, so short that it no longer exists by the time mere diffusion processes would have brought it into the region adjacent the workpiece. Again, employing a differently shaped chamber could assist in bringing the high power deposition regions 11 closer to the workpiece 14, and thereby making it more likely the desired short-lived etchant species reach the workpiece while still viable. However, this reshaping must be balanced against the effect the chamber shape has on the plasma characteristics associated therewith. It has been found that the chamber cannot be reshaped to the extent necessary to ensure many known short-lived etchant species are present at the surface of the workpiece 14. For example, employing the conventional reactor configuration shown in FIG. 1, and a typical etchant gas such as chlorine, short-lived species such as $Cl^+$ and $Cl_2^+$ ions in excited states which are formed in the regions 11 of high power deposition will not diffuse into the region adjacent the workpiece 14 prior to becoming extinct.

Yet another drawback associated with a conventional inductively coupled etch reactor, such as the one shown in FIG. 1, involves the cooling of the walls of the chamber 10. Etching processes are typically only stable and efficient if the chamber temperature is maintained within a narrow range. However, formation of the plasma generates heat which can raise the chamber temperature above the required narrow range. Consequently, it is desirable to remove heat from the chamber 10 in order to maintain the optimum temperature range associated with the etch process being performed. As mentioned previously, this is typically done by flowing coolant fluid through the cooling channels 32 formed within the conductive portion 34 of the chamber 10 and flowing air over the exterior of the insulative chamber walls 30. A problem arises in that the electrically insulative materials, such as quartz or ceramic, typically used to form the chamber walls also exhibit a low thermal conductivity. Thus, the chamber walls are thermally insulative and do not make an ideal heat transfer medium for picking up heat from the interior of the chamber 10 and dumping it into the air flowing over the exterior of the walls. As a result, the chamber temperature tends to fluctuate more than is desired in the region adjacent the insulative chamber walls because the heat transfer from the chamber 10 is sluggish. Often the temperature fluctuations exceed the aforementioned narrow range required for efficient etch processing. In addition, these excessive fluctuations can cause another problem. As discussed previously, etch by-products will tend to deposit on the chamber walls during the etch process. In attempting to control the chamber temperature by air cooling the insulative chamber walls 30, the chamber wall temperature and the layer of etch by-product formed on the interior surface thereof, tends to cycle. This cycling causes thermal stresses within the layer of etch by-product material which result in cracks and pieces of the material flaking off the wall and falling into the chamber. The loose deposit material can contaminate the workpiece, or it can settle at the bottom of the chamber thereby requiring frequent chamber cleaning.

It is often desirable to inject etch process gas directly into the regions having the highest power deposition. In the conventional etch reactor shown in FIG. 1, these regions 11 are immediately adjacent the coil 12. However, pathways to accommodate the gas injection ports 26 cannot be formed in the chamber walls adjacent these areas of high power deposition without physically interfering with the induction coil 12. Thus, the gas has to be injected either in a void at the top of the coil 12 or below the coil. Granted the flow of gas from these ports 26 can be directed toward the regions 11 of high power deposition, but it is has been found that this method is insufficient to ensure the optimum concentration of etchant gas in these regions.

A conventional inductively coupled RF plasma etch reactor also must be operated at relatively low pressures (e.g. below 100 mTorr) in comparison to a conventional capacitively couple etch reactor (which can operated up to 10 Torr). Often etch processes will work best if performed at the higher pressures beyond the range of a conventional inductively coupled plasma reactor. In addition, relatively high RF power levels must be supplied to the coil antenna in order to overcome the impedance created by the insulative chamber walls and still provide enough power to the chamber to ignite and sustain a plasma therein. Accordingly, a large-capacity RF power supply must be employed.

Accordingly, what is needed is an RF plasma etch reactor that is unaffected by conductive etch by-products which deposit on the interior of the chamber. In addition, it is desirable that such an etch reactor be capable of producing a self-bias voltage which will optimize the ion bombardment at the surface of the workpiece, as well as allowing the tailoring of the power deposition within the chamber without the restrictions imposed by the shape of the chamber walls. Further, the etch reactor would preferably have chamber walls which can be maintained within a narrow temperature range which optimizes etch processing and prevents the flaking of deposits. It is also desirable that the gas injection inlets be placeable anywhere on the chamber walls. And finally, the etch reactor would preferably be operable at pressures in excess of about 100 mTorr and using an RF power level less than that required to be supplied to the coil antenna of a conventional inductively coupled RF prasma etch reactor.

SUMMARY

The stated objectives are realized by an RF plasma etch reactor having an etch chamber with electrically conductive walls and a protective layer forming the portion of the walls facing the interior of the chamber. The protective layer prevents sputtering of material from the chamber walls by a plasma formed within the chamber. Absent this protective layer, sputtered material from the walls could degrade the etching process quality and contaminate the workpiece undergoing etch, thereby damaging the devices being formed thereon. Preferably, the electrically conductive chamber walls are made of aluminum and the protective layer is aluminum oxide (i.e. anodized aluminum). However, the protective layer could also be a conductive ceramic material, such as boron carbide. The etch reactor also has an inductive coil antenna disposed within the etch chamber which is used to generate the plasma by inductive coupling. Like the chamber walls, the inductive coil antenna is constructed to prevent sputtering of the material making up the antenna by the plasma. For example, the coil antenna could be made completely of a conductive ceramic such as boron carbide, or it could be constructed so as to have a metal core (e.g. aluminum) with an outer jacket formed of a conductive ceramic material. In addition, the coil antenna could have a tubular structure with a hollow interior channel. This channel would be used to sustain a flow of coolant fluid therethrough so as to cool the antenna and keep it within a prescribed temperature range.

The above-described etch reactor has many advantages over conventional inductively coupled plasma etch reactors. Since the inductive coil antenna is in the inside the etch chamber, rather than wrapped around its exterior, any conductive etch by-products which deposit on the interior surfaces of the chamber walls will have no effect on the amount of power inductively coupled to the plasma. This, in combination with the use of electrically grounded, conductive chamber walls which will be discussed in detail later, prevents the unwanted changes in the plasma characteristics described previously. In addition, employing an internal inductive coil antenna resolves the issues concerning the shape and orientation of the antenna versus the shape of the chamber. The chamber can take on any advantageous shape (e.g. dome shape, cylindrical shape, truncated conical shape, or any combination thereof) without regard to the aforementioned considerations of the coil antenna's shape and orientation, and the corresponding power deposition pattern within the chamber. Likewise, the coil antenna can take on any configuration (e.g. location, shape, orientation) that is necessary to achieve the desired power deposition pattern. As discussed previously, the desired power deposition pattern is one which provides optimum plasma characteristics adjacent the surface of the workpiece undergoing etch processing within the chamber. These plasma characteristics include plasma ion density, plasma ion energy, ion directionality, and etchant species composition, among others. Examples of potential coil antenna configurations for achieving the desired power deposition pattern include constructing the coil antenna with a unitary structure (i.e. one electrically continuous spirally wound conductor) supplied with RF power by a single source of RF power, or constructing the antenna with a segmented structure. The segmented structure involves the use of at least two coil segments wherein each segment is electrically isolated from the other segments and connected to a separate RF power signal. The individual power signals can come from a single RF source with multiple adjustable outputs, or plurality of separate adjustable RF sources. The unitary coil antenna or each of the coil segments can have a planar shape, a cylindrical shape, a truncated conical shape, a dome shape, or any combination thereof. In addition, they can be oriented and located within the chamber as necessary to achieve the desired power deposition pattern.

Another advantage of an etch reactor constructed in accordance with the present invention involves the conductive chamber walls, such as ones made of aluminum. Since the inductive coil antenna is located inside the etch chamber, there is no need to make the chamber from an insulative material, as is the case when the antenna is wrapped around the outside of the chamber. A conductive material is chosen for the chamber walls for several reasons. First, the conductive walls can be electrically grounded. In this way, the walls can serve as an electrical ground (i.e. anode) for the previously-described workpiece-supporting pedestal which is connected to a source of RF power to create a bias voltage at the surface of the workpiece. The interior surface area of the chamber walls will greatly exceed the exterior surface area of the pedestal. Therefore, a larger negative bias voltage will result and a relatively strong ion bombardment can be achieved, in comparison to conventional inductively coupled plasma etch reactors. In addition, since the chamber walls are already conductive, any conductive by-products from etching processes performed in the reactor which deposit on the chamber walls will not have a detrimental effect on the plasma characteristics. For example, there would be no sudden increase in the capacitive coupling of RF power and ion energy caused by an electric coupling of the deposits to the grounded areas of the reactor which act as an anode for the energized workpiece pedestal. Thus, the use of electrically grounded conductive chamber walls in combination with an internal inductive coil antenna ensures, that the plasma characteristic do not change even when the etch process results in conductive by-products coating the interior walls of the chamber.

Chamber walls made of a conductive metals such as aluminum would also exhibit significantly greater thermal conductivity than that of conventionally employed electrically insulative materials such as quartz or ceramic. This results in a quicker transfer of heat from the interior of the chamber to coolant fluid flowing through cooling channels formed in the chamber walls. Therefore, it is easier to maintain a narrow chamber temperature range and avoid the problems of a conventional etch reactor in connection with the cracking and flaking off of deposits from the chamber walls. Additionally, it is easier and less expensive to form cooling channels in aluminum chamber walls than in the conventional quartz walls.

It is further envisioned that measures other than the location, shape, and orientation of the coil antenna or coil segments can be employed to tailor the power deposition pattern within the etch chamber. For example, one or more electrically grounded shielding element(s) could be placed between the antenna or antenna segments and the workpiece to decrease the amount of RF power inductively coupled to the region of the plasma beyond each shielding element. These shielding elements could take the form of an electrically grounded Faraday shield or conductive screen. Alternatively, a magnetic field generator could be employed to generate a blocking magnetic field within the chamber. The field would be oriented so as to reduce the number of etchant gas ions formed by the plasma which are allowed to travel between the inductive coil antenna (or segments) and the workpiece. The field generator can include either a permanent magnet or an electromagnet, and preferably has the capability to vary the magnetic field generated so as to adjust the number of etchant gas ions allowed to travel between the inductive coil antenna (or segments) and the workpiece.

Another envisioned measure involves individually selecting the power levels of the RF power signals supplied to the coil segments (when used) to further tailor the power deposition pattern within the etch chamber. For example, an RF power signal exhibiting a higher power level supplied to a particular coil segment would produce a region of higher power deposition adjacent that coil in comparison to regions adjacent other similarly configured segments supplied with an RF signal having a lower power level.

Yet another advantage of an etch reactor constructed in accordance with the present invention concerns the flexibility with which etchant gas ports or inlets can be placed in the chamber walls. In conventional inductively coupled plasma etch reactors, the inductive coil antenna precluded the incorporation of gas inlets on the portion of the chamber walls adjacent to the externally wrapped coil. This is troublesome because it is often desirable to inject etchant gas into regions of high power deposition, such as those formed immediately adjacent the coil antenna. Since the inductive coil antenna is disposed within the chamber of a reactor according to the present invention, this limitation in the placement of etchant gas inlets no longer exist. Thus, the inlets can be placed practically anywhere on the interior of the chamber walls, particularly in locations directly adjacent regions of high power deposition.

In addition to the above-described advantages of a plasma etch reactor constructed in accordance with the present invention, it is pointed out that the amount of RF power inductively and capacitively coupled into the chamber can be varied by simply adjusting the amount of RF power supplied to the inductive coil antenna (or segments) and the energized pedestal. For example, a capacitively coupled plasma can be formed by providing RF power solely to the pedestal (and/or the conductive chamber walls). Conversely, a purely inductively coupled plasma can be formed by providing RF power solely to the inductive coil antenna, or if applicable, to one or more of the independently powered coil segments. Or, the reactor can be operated using any desired mix of inductively and capacitively coupled RF power. Thus, the reactor can operated in an inductively coupled mode, capacitively coupled mode, or a combined mode. This provides the opportunity to use the reactor to perform a variety of etch operations over a wide process window.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 2:
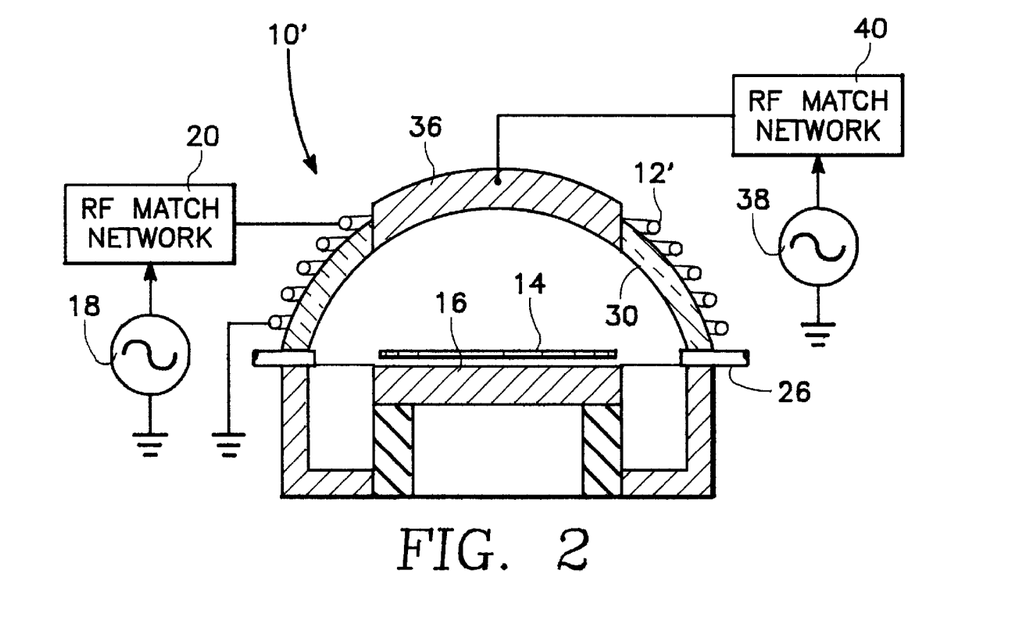
FIG. 2 is a cross-sectional view of an inductively coupled RF plasma etch reactor with a dome-shaped chamber employing a cleaning electrode.

The problem of reduced inductive coupling of RF power into the chamber of a plasma etch reactor due to the build-up of conductive etch by-products on the interior walls of the chamber can be approached in several ways. For example, a self cleaning process can be employed wherein the chamber walls are cleaned of conductive deposits during the etch process itself. This self cleaning process involves the use of RF powered electrodes which replace portions of the chamber walls. As shown in the reactor having a dome-shaped chamber 10' and inductive coil antenna 12' of FIG. 2, such an electrode 36 can be disposed at the top of the chamber 10' in a central void located at the apex of the coil 12'. The electrode 36 is energized via an RF power generator 38 through a matching network 40. The electrode 36 is energized via the generator 38 at a low voltage during etch processing to keep conductive etch by-products from forming on the electrode 36 or immediately adjacent areas. This voltage would be low enough that the energized electrode 36 does not significantly affect the etching process. However, the further away from the electrode 36 that an area of the chamber wall is, the less the cleaning effect and the more likely conductive deposits will form. Therefore, to be effective, multiple electrodes would have to be employed and placed close enough to each other that the entire interior surface of the chamber adjacent the coil is protected from the formation of conductive etch by-products. However, it has been found that the electrode voltage has to be kept at such a low level, so as to not substantially affect the etch process, that electrodes merely placed at the top and bottom of the coil 12' are not sufficient to keep the entire chamber wall adjacent the coil 12' free of deposits. Further, it is not possible to place electrodes on the interior wall adjacent (i.e. directly underneath) the coil 12' without interfering with the inductive coupling of power in to the reactor chamber 10'. Accordingly, this approach, while reducing the problem, cannot completely eliminate it, and so is not as preferred as other approaches to be discussed later in this specification.

Another approach to the conductive etch by-product deposit problem involves heating the chamber walls to a temperature above the deposition temperature of the particular conductive etch by-product causing the problem. However, this approach has drawbacks as well. The highest practical temperature that the chamber wall of a typical inductively-coupled etch reactor, such as the one depicted in FIG. 1, can be heated to is about 200 degrees Centigrade. Higher temperatures would degrade the organic seals usually employed to seal the various access points to the chamber. Some of the previously-described metals which are to be etched produce conductive by-products which have deposition temperatures exceeding 200 degrees Centigrade. For example, the etching of both copper and platinum produce conductive by-products with deposition temperatures exceeding approximately 600 degrees Centigrade. It might be possible to replace the typically used organic seals with ones made of metal. However, such metal seals are usually only effective for one etch operation because they are susceptible to changes in metallic structure or physical deformation at high temperatures which would degrade their ability to seal the chamber. For example, a typical aluminum seal would deform at approximately 400 degree Centigrade, and could not be reused. The need to replace the seals in the etch reactor after every etch operation would be unacceptable to most users. Thus, while this approach is useful when the deposition temperature of the conductive etch by-product causing the attenuation of inductively coupled RF power is relatively low (e.g. less than about 400 degrees Centigrade if aluminum seals are employed), a more comprehensive solution is preferred.

Figure 3:
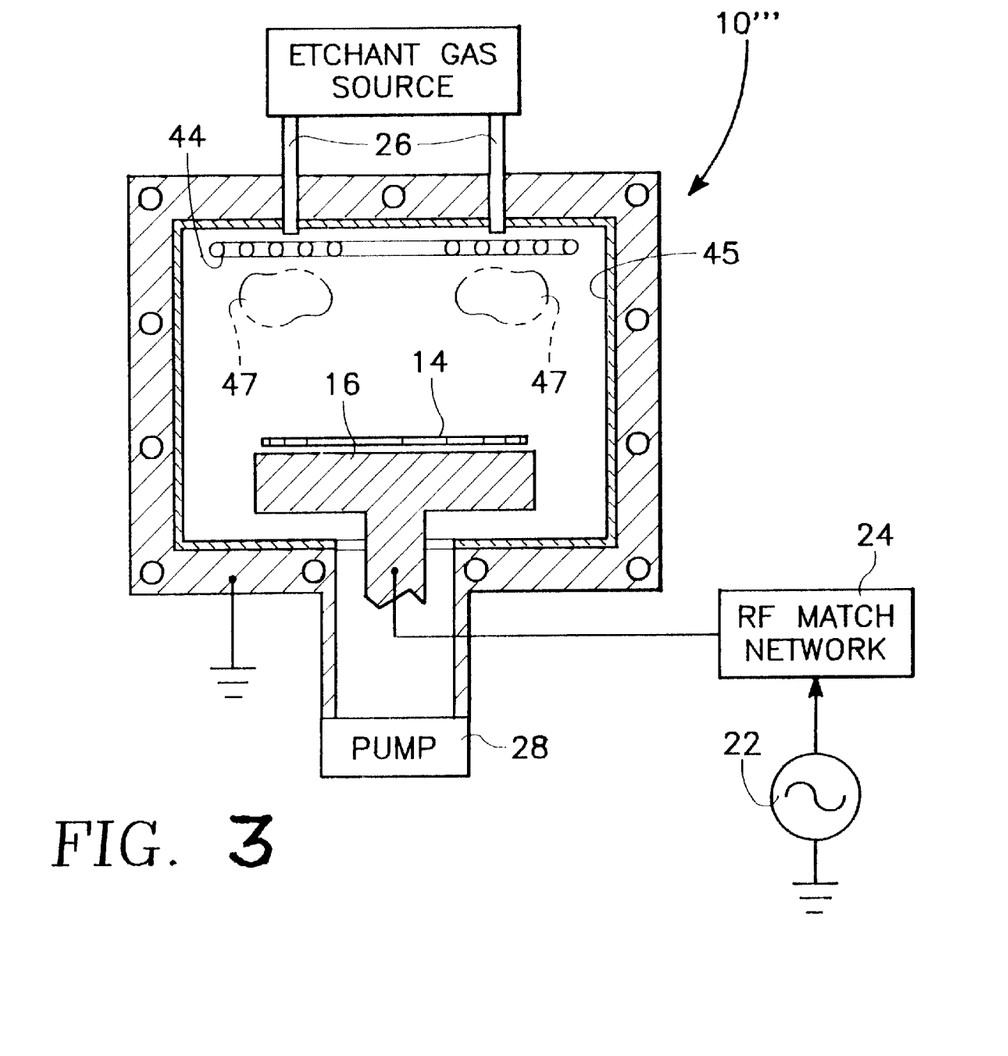
FIG. 3 is a cross-sectional view of an RF plasma etch reactor constructed in accordance with the most preferred embodiment of the present invention.

FIG. 3 depicts an RF plasma etch reactor constructed in accordance with the most preferred solution to the problem of reduced inductive coupling of RF power due to the build-up of conductive etch by-products on the interior walls of the reactor chamber 10'''. Like conventional inductively coupled plasma etch reactors (e.g. FIG. 1), there is a vacuum chamber 10''', a pedestal 16 for supporting a workpiece 14, a bias RF power generator 22 and associated impedance matching circuit 24 for imposing a RF bias on the workpiece 14, and a vacuum pump 28 to evacuate the chamber 10''' to a desired chamber pressure. However, the inductive coil antenna 44 is quite different. Rather than being wrapped around the outside of the reactor chamber 10''', the coil 44 is disposed inside the chamber. This places the coil beyond any conductive etch by-product coating on the interior walls of the chamber. Thus, the conductive coating cannot attenuate the magnetic field generated by the energized coil 44 (or at least the portion directed into the plasma region of the chamber), and so there is no decrease in the inductive coupling of RF power to this region. As a result, there is no detrimental effect on the plasma characteristics or difficulty in igniting and maintaining a plasma within the chamber. Of course, since the coil 44 is energized during etch processing, there will be no deposition of etch by-products thereon which could interfere with the inductive coupling of power. Further, since the antenna is inside of the chamber it can generate a plasma using a lower level of RF power because the impedance of the chamber walls need not be overcome as is the case with a conventional inductively coupled plasma etch reactor.

The interior coil 44 is shown in FIG. 3 as having a unitary, planar configuration and is disposed near the top of the chamber 10'''. This embodiment of the coil is unitary in that it is constructed from an electrically continuous, spirally wound conductor. However, the coil can alternately take on a variety of shapes and locations within the chamber. In addition, the coil can be segmented, with the segments being electrically isolated and separately powered. FIGS. 4A–F are examples of etch reactors employing these segmented, separately powered, interior coils. All these examples depict a coil having a first coil segment 46a–f and a second coil segment 48a–f. The first coil segment 46a–f is energized via an external RF power source having a first RF power generator 50a–f and first impedance matching network 52a–f. The second coil segment 48a–f is energized via an external RF power source having a second RF power generator 54a–f and second impedance matching network 56a–f. Separate power sources are shown supplying RF power to each of the coil segments 46a–f, 48a–f as well as the pedestal 16. This allows the amount of power, as well as the frequency to be individually set for each of these elements. For example, different RF power levels or frequencies may be applied to different coil segments by the separate RF power generators connected thereto to adjust plasma ion density spatial distribution. A common power source could also be employed for any number, or all, of the aforementioned elements if desired. Preferably this common source would have the ability to supply RF power to the individual elements at different power levels and frequencies. It is noted that the number of turns of each coil segment implied by the their illustration in FIGS. 4A–F (as well as the single coil of FIG. 3) is for representational purposes only. The coil or coil segments may actually have any number of turns.

Figure 4A:
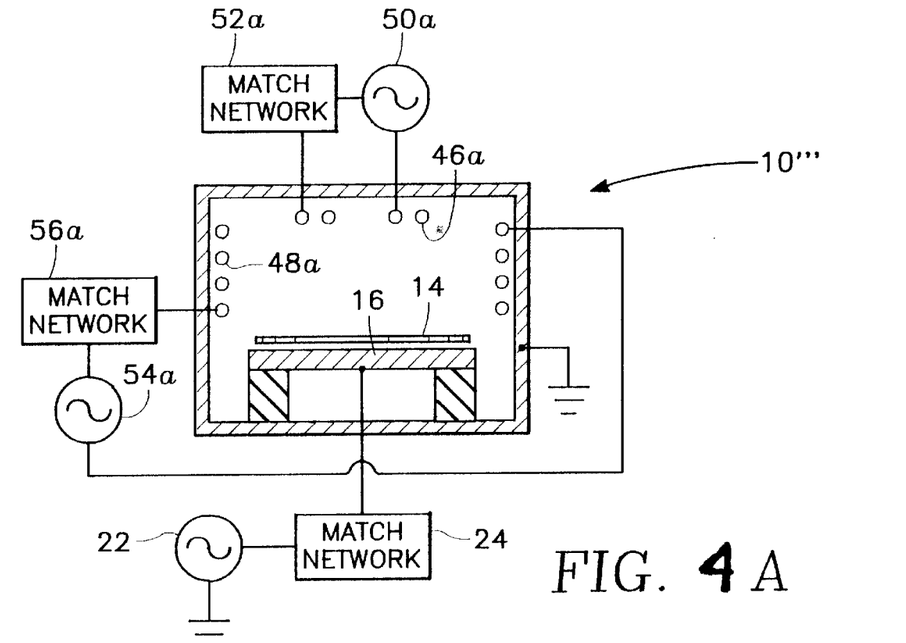
FIGS. 4A–F are generalized cross-sectional views of RF plasma etch reactors constructed in accordance with the most preferred embodiment of the present invention employing electrically isolated, separately powered, inductive coil antenna segments.
Figure 4B:
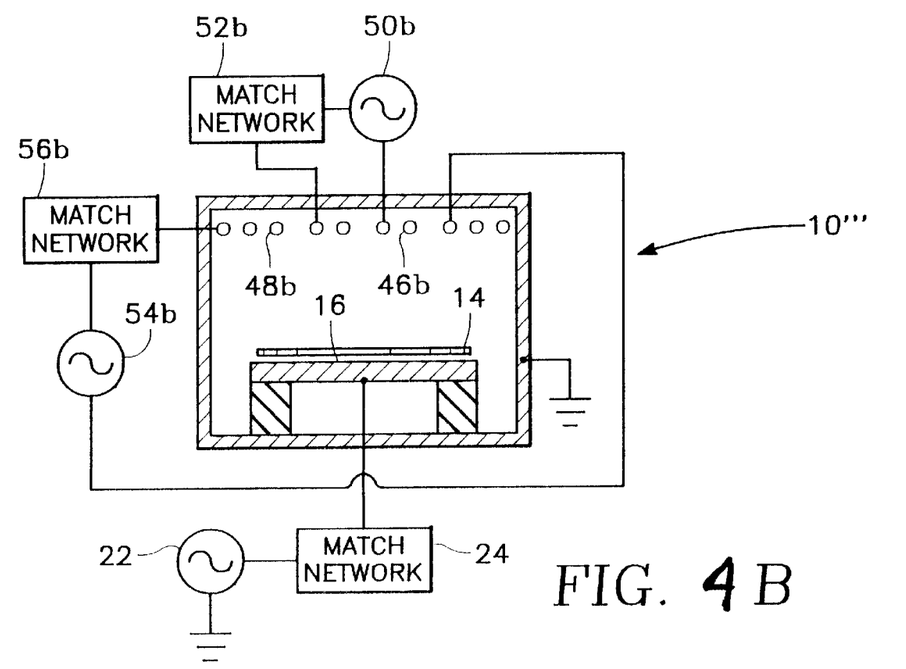
Figure 4C:
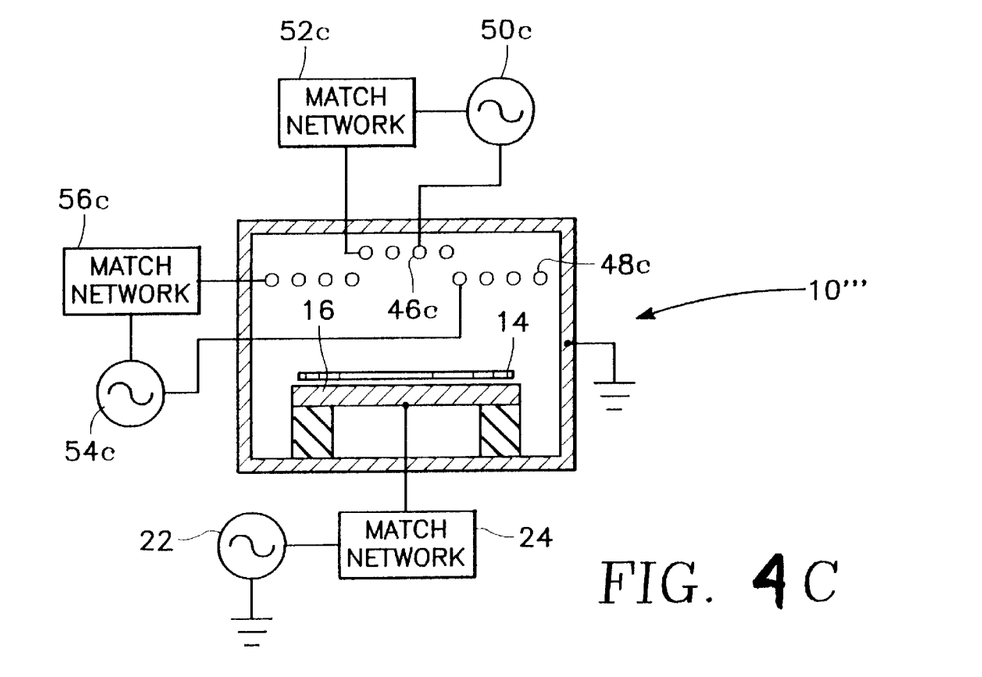
Figure 4D:
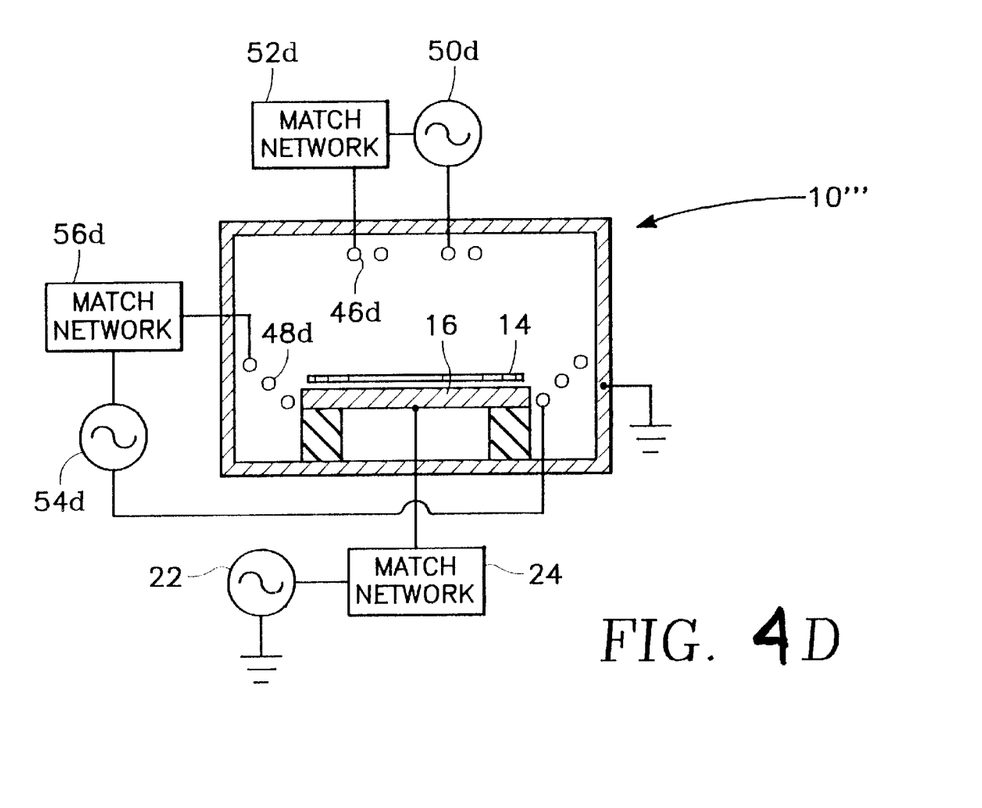
Figure 4E:
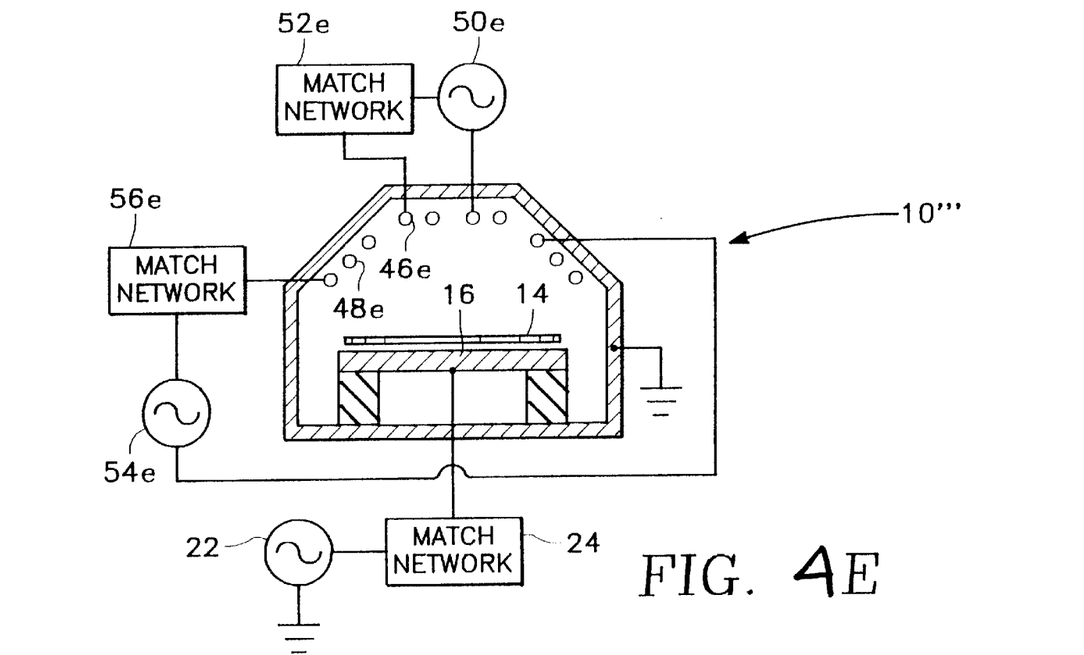
Figure 4F:
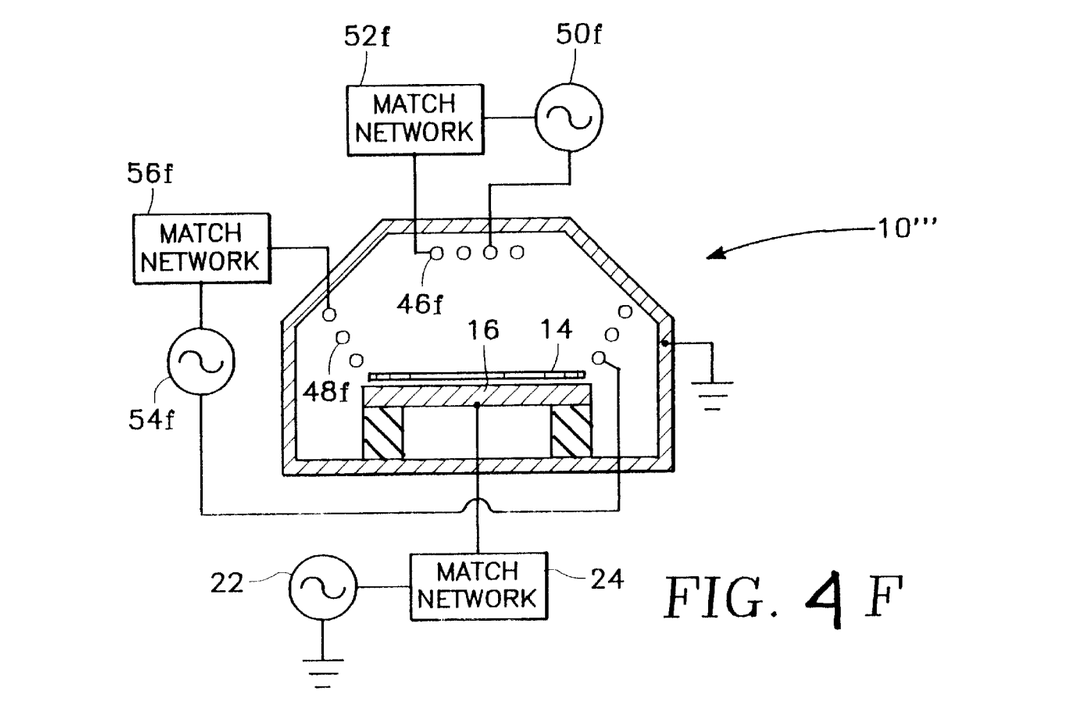

As can be seen the primary difference between the reactors shown in FIGS. 4A–F, respectively, is the shape and location of the coil segments 46a–f, 48a–f. In FIG. 4A, the first coil segment 46a is planar in shape and is disposed near the top of the chamber 10''', while the second coil segment 48a is cylindrical in shape and located near the side walls of the chamber. In FIG. 4B, both coil segments 46b, 48b are planar and located near the top of the chamber 10''', with the first segment 46b being concentric with and disposed within a central void of the second segment 48b. FIG. 4C depicts a coil segment configuration much the same that of FIG. 4B, except the second coil segment 48c is located further down in the chamber closer to the workpiece 14. In the reactor of FIG. 4D, the first coil segment 46d is planar in shape and is disposed near the top of the chamber 10''', while the second coil segment 48d has an inverted, truncated, conical shape which is located so as to surround the workpiece 14. The reactors of FIGS. 4A–D are shown with cylindrical shaped chambers 10'''. However, this need not be the case. Since the inductive coil antenna resides inside the chamber 10''', the shape of the chamber can be tailored to optimize its effect on the plasma. In other words, the shape of the coil is no longer a key consideration in the design of the chamber, therefore, the chamber can be configured in any appropriate shape, preferably one which will enhance the particular plasma characteristic desired for the etch operations to be performed with the reactor. For example, FIGS. 4E–F depict reactors with truncated conical shaped chambers 10'''. In FIG. 4E, the first coil segment 46e is planar and disposed near the top of the chamber 10''', while the second segment 48e has a truncated, conical shape and is located adjacent the side walls of the chamber 10'''. The reactor of FIG. 4F is similar to that of FIG. 4E with the exception that the second coil segment 48f has an inverted, truncated, conical shape and is located further down in the chamber 10''' nearer the workpiece 14. Of course, many other chamber shapes are possible, for example, the chamber could be dome shaped, or it could have an aggregate shape incorporating two or more of the previously mentioned dome, cylindrical and truncated conical shapes. As the particular shape of the chamber which will optimize the desired plasma characteristics for a type of etching being performed is beyond the scope of the present invention, no further details will be provided herein. Further, the inductive coil antenna or segments thereof can be disposed within the chamber by any appropriate well known method, such as by mounting or suspending them from the chamber walls. As these methods are also well known and do not form a novel aspect of the present invention, no further details will be provided.

FIGS. 4A–F depict inductive coil antennas having two individually powered coil segments. However, the present invention is not limited to just two segment. Rather any number of individually powered segments could be employ. Further, like the shape of the chamber, the coil or coils segments can take on any advantageous shape. As the inductive coil antenna is disposed inside the chamber 10''', it can take on any shape desired, independent of the shape of the chamber. Thus, the previously described tradeoff between the shape of the coil and the chamber is no longer a concern. It is also noted that although only planar, cylindrical, and truncated conical shaped coil and coil segments are depicted in FIGS. 3 and 4A–F, the present invention is not limited to these shapes. Rather the coil or coil segments can have any advantageous shape, such as a dome shape or an aggregate of two or more of the aforementioned planar, dome, cylindrical and truncated conical shapes. In addition, it is not intended to imply that the location within the chamber where the coil or coil segments reside is limited the depicted embodiments. The coil or coil segments can be located and oriented in any advantageous configuration desired.

A significant advantage of placing the inductive coil antenna within the chamber is that, without the restrictions caused by the shape of the chamber, the power deposition can be optimized for the intended etch processes to be performed within the chamber. Placing the coil or coil segments inside the chamber allow considerable flexibility in shaping the power deposition. Such factors as the shape, location, and orientation of the coil or each coil segment can be chosen so as to create an optimal power deposition pattern within the chamber. These factors can also be chosen in view of the expected diffusion characteristics and life spans of the etchant species involved in the particular etch process envisioned for the reactor. Further, the amount of RF power supplied to the coil or coil segments can be varied to tailor the power deposition and etchant species distributions, thereby allowing the same coil configuration to accommodate the diffusion characteristics of a wider range of etchant species types. The specific coil or coil segment configuration and RF power input settings thereto which will optimize the power deposition and etchant species diffusion for the particular etch process to be performed is beyond the scope of the present invention. Accordingly these details will not be discussed herein.

Figure 5A:
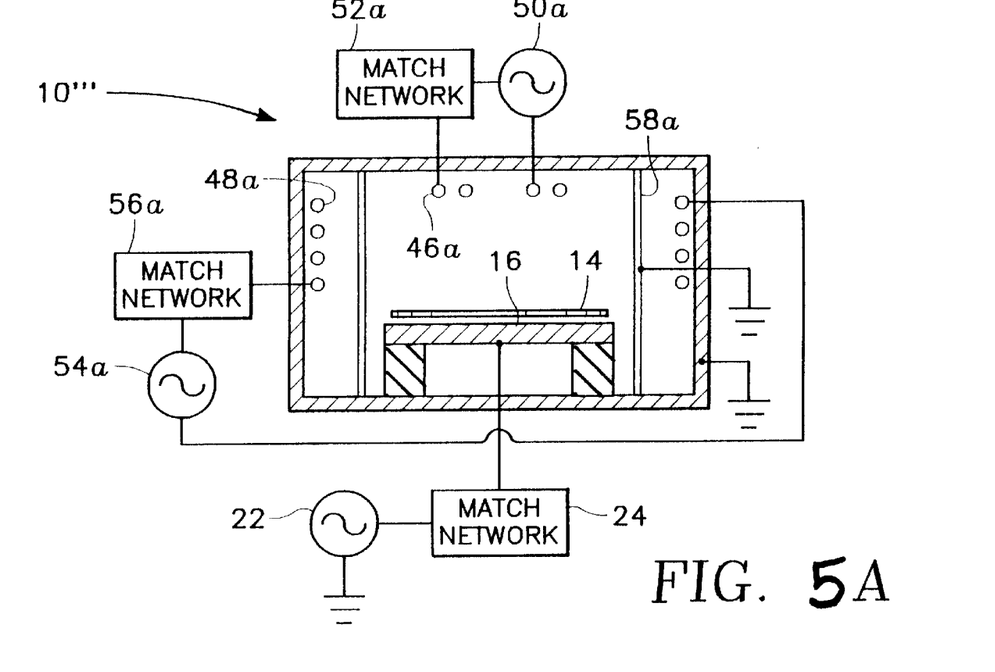
FIGS. 5A–B are generalized cross-sectional views of RF plasma etch reactors constructed in accordance with the most preferred embodiment of the present invention employing electrically isolated, separately powered, inductive coil antenna segments and shielding elements.
Figure 5B:
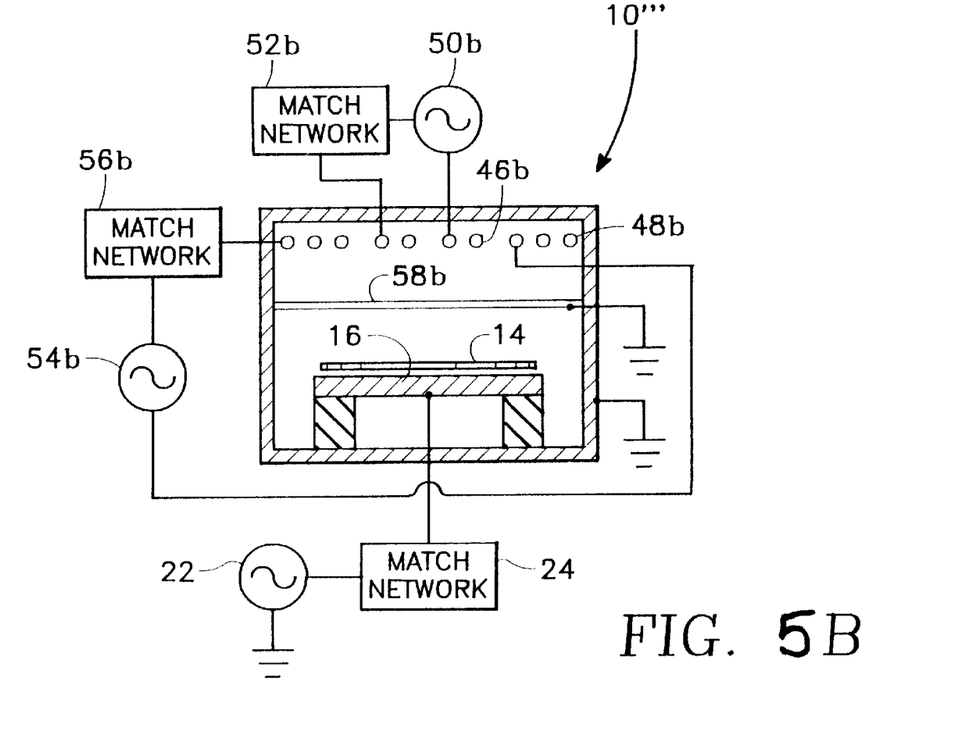

In addition to the coil related factors such as shape, location, and orientation which can be manipulated in an effort to optimize the power deposition and etchant species diffusion patterns within the chamber, shielding elements or fields can also be introduced into the chamber to further tailor these patterns. For example, a shielding element or field could be used to decrease the plasma ion energy in a particular region of the chamber. FIGS. 5A–B (which correspond to the reactors described in conjunction with FIGS. 4A–B, respectively) depict a shielding element 58a–b placed between one or more of the coil segments and the workpiece to affect the power deposition adjacent the element. This shielding element 58a–b preferably takes the form a Faraday-type shield or conductive screen. In either case the shielding element 58a–b is electrically grounded. The grounded element 58a–b attenuates the magnetic field generated by the adjacent coil segment or segments, thereby decreasing the inductive coupling of RF power to the plasma on the other side of the shield. In this way the power distribution in the areas beyond the shielding element 58a–b can be reduced as desired, for example to decrease the plasma ion energy in the region. In FIG. 5A, a cylindrical shielding element 58a is employed adjacent the cylindrical second coil segment 48a to reduce the RF power inductively coupled by this segment to the plasma region in the center of the chamber 10'''. This is an example where only one of the coil segments is significantly affected. FIG. 5B illustrates an embodiment where the inductively coupled RF power from multiple coil segments (in this case two) is attenuated using a shielding element 58b. The shielding element 58b is placed horizontally within the chamber below the first and second coil segments 46b, 48b. This horizontal placement causes a reduction in the RF power inductively coupled by each segment 46b, 48b to the plasma region directly overlying the workpiece 14 on the opposite side of the shield element 58b. Thus, the shielding element can be used to affect one or more, even all, of the coil segments employed in the reactor. In addition, more than one shielding element could be employed to accomplish this task, if desired.

Figure 6:
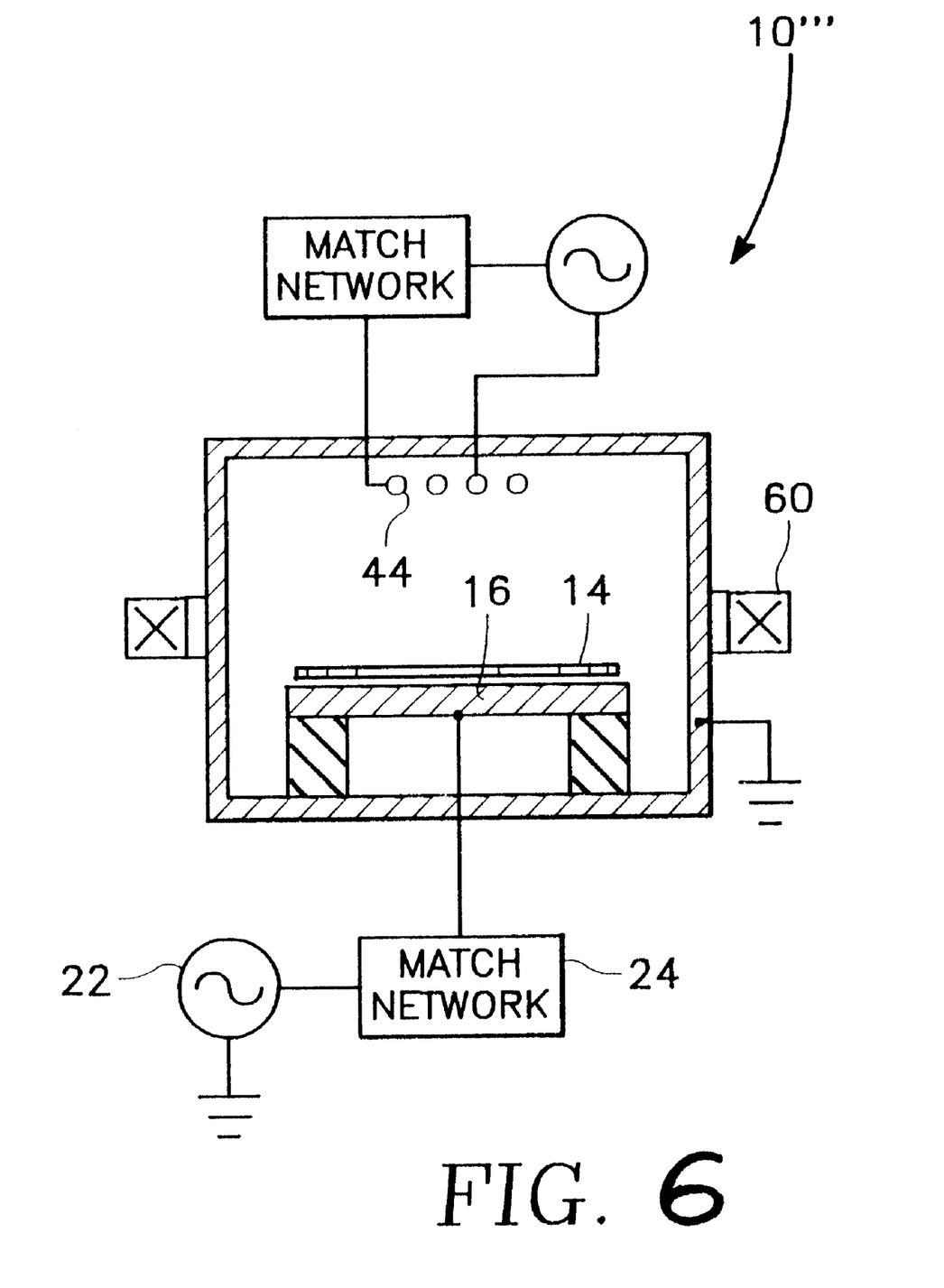
FIG. 6 is a generalized cross-sectional view of an RF plasma etch reactor constructed in accordance with the most preferred embodiment of the present invention employing electrically isolated, separately powered, inductive coil antenna segments and a magnetic field generator which produces a magnetic blocking field.

An alternative way of manipulating the power deposition is to introduce a second magnetic field into the chamber. As illustrated in FIG. 6, this can be accomplished by the addition of a magnetic field generator 60 outside the chamber 10'''. The generator 60, which can include either an electromagnet or a permanent magnet, creates a magnetic field within the chamber 10''' which blocks the passage of ions. Thus, if the blocking magnetic field is imposed between the inductive coil antenna 44 (or segments thereof as would be the case in some embodiments of the present invention) and the workpiece 14, ions can be prevented from reaching the workpiece. The stronger the magnetic field, the fewer ions that will be able to pass through and impact the surface of the workpiece. It is preferred that the generator 60 be adjustable so as to vary the strength of the blocking magnetic field. In this way the quantity of ions passing through to the workpiece 14 can be adjusted. Accordingly, plasma characteristics such as ion density and ion energy can be controlled at the surface of the workpiece 14 by adjusting the strength of the blocking magnetic field.

Yet another advantage of placing the inductive coil antenna within the chamber is that the chamber need not be made of an insulative material. As explained previously, the portion of the chamber walls underlying the inductive coil antenna had to be made from a non-conductive material, typically quartz or ceramic, to prevent significant attenuation of the magnetic field generated by the coil which would decrease the inductively coupling of RF power into the chamber. With the coil inside the chamber this problem is no longer a consideration. Therefore, the chamber walls can be made of conductive materials, such as aluminum. Making the chamber walls conductive has many desirable effects. First, as shown in FIG. 3, the chamber 10''' can be electrically grounded and serve as the electrical ground for the RF power supplied through the pedestal 16. The surface area of the chamber walls is significantly greater than the previously employed grounded areas. In addition, the interior surface area of the now conductive and grounded chamber walls will greatly exceed that of the RF energized pedestal 16. This will create a larger negative bias voltage, thereby making it feasible to produce a more optimum plasma ion energy and directionality at the surface of the workpiece.

Another advantage of employing conductive chamber walls is that it solves the problem caused by the deposition of conductive by-products wherein the plasma characteristics (e.g. plasma ion energy and directionality) are adversely affected by the voltage shift that occurred when the conductive deposits electrically coupled with the grounded areas of the chamber. Since the chamber walls are already conductive and electrically grounded, the deposition of additional conductive material on the interior surface of the walls is irrelevant and has no effect on the bias voltage or the plasma characteristics.

The final advantage that will be discussed in connection with the use of conductive chamber walls is the enhanced cooling capability such walls can afford. For example, chamber walls made of aluminum exhibit a much higher thermal conductivity in comparison to the quartz walls of conventional inductively coupled plasma etch reactors (e.g. 204 W/mK for aluminum compared with 0.8 W/mK for quartz). In addition, as cooling channels 32 are easily formed in aluminum chamber sidewalls and the entire chamber can now be made of aluminum, cooling channels can be distributed throughout the chamber walls. This eliminates the need for air cooling the exterior of the chamber walls as was necessary with a conventional inductively coupled RF plasma etch reactor. Flowing coolant through internal cooling channels is a much more efficient method of heat transfer. Consequently, heat transfer from the chamber interior to coolant fluid flowing in the cooling channels 32 formed in the chamber walls is much quicker. This increased rate of heat transfer allows for much less variation in the chamber temperature. As a result, the chamber temperature can be readily maintained within that narrow range necessary to ensure efficient etch processing and to prevent the cracking and flaking off of contaminating deposits from the chamber walls.

Conductive chamber walls made of metals such as aluminum can, however, have a potential drawback. These materials would tend to sputter under some etch processing conditions. The material sputtered off of the walls could contaminate the workpiece and damage the devices being formed thereon. This potential problem is prevented by forming a protective coating 45 over the interior surface of the chamber walls, as shown in FIG. 3. This coating 45 is designed to be resistant to the effects of the plasma and so prevents the conductive material from being sputtered into the chamber 10'''. Further, the coating 45 is designed to have an insignificant effect on the electrical and thermal properties exhibited by the walls. If the chamber walls are aluminum, it is preferred the interior surface be anodized (i.e. coated with a layer of aluminum oxide). The anodized aluminum layer will provide the protective characteristics discussed above. Alternatively, a conductive ceramic material could be chosen to coat the interior walls of the chamber to prevent sputtering and surface reaction on the walls. For example, boron carbide would be an appropriate choice.

A similar sputtering problem exists with the inductive coil antenna or segments described previously. If the coil or coil segments were to be formed of a metal, the unwanted sputtering of this metal by the plasma could contaminate the workpiece, and would quickly erode the coil structure. One solution is to make the coil or coil segments from a "non-sputtering" conductive material, such as a conductive ceramic like boron carbide. Another possibility would be to use a metal core surrounded by a "non-sputtering" coating. For example, an aluminum core covered with a boron carbide jacket. In either embodiment, the coil would be protected from the sputtering effects of the plasma and any contamination of the workpiece prevented. It is also noted that the temperature of the coil during etch processing must often be controlled. If such is the case, the coil can be constructed with a hollow, tube-like structure. This would allow coolant fluid to be pumped through the channel formed by the interior of the coil, thereby cooling the coil and maintaining the desired operating temperature.

Still another advantage of placing the inductive coil antenna within the chamber of an inductively couple plasma etch reactor is that the coil no longer dictates where the etchant gas ports can be located. As explained previously the etchant gas ports could not be located on the chamber wall adjacent an external inductive coil because the coil would physically interfere with the necessary channeling and feed structures needed to supply such a gas injection port with etchant gas. This was disadvantageous because it is often desirable to introduce etchant gas into a region of high power deposition, such as the ones formed just inside the chamber wall adjacent the external coil. Since the coil no longer blocks access to the interior of the chamber through the chamber walls, the locations where injection ports can be placed is increased significantly. As a result, gas injection ports can be located so that etchant gas is introduced near areas of high power deposition, or away from these areas, as desired. For example, FIG. 3 shows gas injection ports 26 located adjacent the inductive coil antenna 44 such that they are able to inject gas into areas 47 of high power deposition near the coil antenna. Accordingly, there is a much greater versatility in port placement possible with a reactor constructed in accordance with the present invention.

In addition to the advantages of an etch reactor constructed in accordance with the present invention which have been described thus far, it is also pointed out that the reactor could be operated in a capacitively coupled mode, in an inductively coupled mode, or any combination thereof. Referring once again to FIGS. 3 and 4A–F, if RF power is supplied to the pedestal 16, without also supplying RF power the coil antenna 44 or segments 46, 48, the reactor will operate in a capacitively coupled mode. This is not possible in a conventional inductively coupled plasma etch reactor, such as shown in FIG. 1, due to the previously-described inadequate area ratio between the pedestal 16 and the conductive portion 34. The area ratios typically found in conventional reactors produce poor capacitive power coupling which has been found insufficient to generate a plasma within the chamber.

Alternatively, RF power could be supplied to the coil antenna 44 or segments 46, 48, without also supplying RF power the pedestal 16. Thus, the reactor would operate in an inductively coupled mode.

Inductive coupling will be more efficient at pressures ranging between about 1 mTorr and 100 mTorr, while capacitive coupling will be more efficient at pressures ranging between about 100 mTorr and 10 Torr. Some etch processes are best performed at lower pressures consistent with inductive coupling, whereas other etch processes are best performed at the higher pressures consistent with capacitive coupling. Thus, a reactor constructed in accordance with the present invention has a greater versatility than either a conventional inductively coupled or capacitively coupled plasma etch reactor because it can support etch processing over much wider pressure ranges. Additionally, inductive coupling will generate more ions, while capacitive coupling will produce more reactive neutral species. Different etching processes or process steps often call for more ions or more reactive neutral species, depending on the desired result. A reactor constructed according to the present invention can control the composition of the plasma in ways not possible with conventional inductively coupled or capacitively coupled etch reactors because the amount of RF power inductive and capacitive coupled into the chamber 10 can be readily varied by varying the amount of power supplied to the pedestal 16 and internal coil antenna 44 (or antenna segments 46, 48). For example, some steps of an etch process can be performed with more inductive coupling to create an ion-rich plasma, while other steps can be performed with more capacitive coupling to create a reactive neutrals-rich plasma. Further, the inductive coil antenna 44 (or segments 46, 48) need not be the only source employed to sustain the plasma. Rather, the plasma can be at least partially sustained via capacitive coupling using the energized pedestal 16. This allows the RF power supplied to the antenna (or segments) to be tailored to produce the desired etchant species concentrations without regard to the power necessary to sustain the plasma.

While the invention has been described in detail by specific reference to preferred embodiments, it is understood that variations and modifications thereof may be made without departing from the true spirit and scope of the invention.

What is claimed is:

1. An RF plasma etch reactor, comprising:
   a chamber having chamber walls comprising a protective layer forming a portion of the walls facing the interior of the etch chamber, the protective layer capable of preventing sputtering of the chamber walls by a plasma formed within the chamber;
   an etchant gas injection apparatus capable of introducing etchant gas into the chamber;
   a pedestal disposed within the chamber for holding a workpiece to be etched; and
   an inductive coil antenna disposed within the chamber, the inductive coil antenna being capable of radiating RF energy into the etchant gas to generate the plasma within the chamber by inductive coupling; and the inductive coil antenna comprising a non-sputtering conductive material and disposed within the chamber so that the non-sputtering conductive material is exposed to the plasma.

2. The reactor of claim 1, wherein the inductive coil antenna has a unitary structure and is connected to a source of RF power.

3. The reactor of claim 2, wherein the location, shape and orientation of the inductive coil antenna are selected so as to tailor the RF power deposition pattern within the chamber, said power distribution pattern being tailored to provide optimum plasma characteristics adjacent the surface of the workpiece undergoing etching within the chamber.

4. The reactor of claim 3, further comprising at least one electrically grounded shielding element capable of decreasing the amount of RF power inductively coupled from the inductive coil antenna to a region of the plasma beyond each shielding element, wherein each shielding element is used to further tailor the RF power deposition pattern within the chamber.

5. The reactor of claim 4, wherein the shielding element is one of (i) a Faraday shield, or (ii) a conductive screen.

6. The reactor of claim 3, further comprising a magnetic field generator capable of generating a blocking magnetic field within the chamber oriented so as to reduce the number of etchant gas ions formed by the plasma traveling between the inductive coil antenna and the workpiece, wherein the magnetic field generator is used to further tailor the RF power deposition pattern within the chamber.

7. The reactor of claim 6, wherein the magnetic field generator is one of (i) a permanent magnet, or (ii) an electromagnet.

8. The reactor of claim 6, wherein the blocking magnetic field generated by the magnetic field generator is capable of being varied so as to adjust the number of etchant gas ions allowed to travel between the inductive coil antenna and the workpiece.

9. The reactor of claim 2, wherein the inductive coil antenna has one of the following shapes: (i) a planar shape, (ii) a cylindrical shape, (iii) a truncated conical shape, or (iv) a dome shape.

10. The reactor of claim 2, wherein the inductive coil antenna has an aggregate shape constituting at least two of the following shapes: (i) a planar shape, (ii) a cylindrical shape, (iii) a truncated conical shape, or (iv) a dome shape.

11. The reactor of claim 1, wherein the inductive coil antenna comprises a plurality of segments, each segment being electrically isolated from the other segments and connected to a separate RF power signal.

12. The reactor of claim 11, wherein each RF power signal is generated by a common RF power source, and wherein said common power source is capable of supplying each RF power signal with a different power level and frequency.

13. The reactor of claims 11, wherein each RF power signal is generated by a different RF power source, and wherein each RF power source is capable of supplying a RF power signal having a different power level and frequency.

14. The reactor of claim 11, wherein the location, shape and orientation of each segment of the inductive coil antenna is selected so as to tailor the RF power deposition pattern within the chamber, said power distribution pattern being tailored to provide optimum plasma characteristics adjacent the surface of the workpiece undergoing etching within the chamber.

15. The reactor of claim 14, wherein the RF power signals are individually selected so as to further tailor the RF power deposition pattern within the chamber.

16. The reactor of claim 14, further comprising at least one electrically grounded shielding element capable of decreasing the amount of RF power inductively coupled from at least one of the segments of the inductive coil antenna to a region of the plasma beyond each shielding element, wherein each shielding element is being used to further tailor the RF power deposition pattern within the chamber.

17. The reactor of claim 16, wherein the shielding element is one of (i) a Faraday shield, or (ii) a conductive screen.

18. The reactor of claim 14, further comprising a magnetic field generator capable of generating a blocking magnetic field within the chamber oriented so as to so as to reduce the number of etchant gas ions formed by the plasma traveling between at least one of the inductive coil antenna segments and the workpiece, wherein the magnetic field generator is used to further tailor the RF power deposition pattern within the chamber.

19. The reactor of claim 18, wherein the magnetic field generator is one of (i) a permanent magnet, or (ii) an electromagnet.

20. The reactor of claim 18, wherein the blocking magnetic field generated by the magnetic field generator is capable of being varied so as to adjust the number of etchant gas ions allowed to travel between the at least one inductive coil antenna segments and the workpiece.

21. The reactor of claim 11, wherein each segment of the inductive coil antenna has one of the following shapes: (i) a planar shape, (ii) a cylindrical shape, (iii) a truncated conical shape, or (iv) a dome shape.

22. The reactor of claim 11, wherein at least one of the plurality of segments of the inductive coil antenna has an aggregate shape constituting at least two of the following shapes: (i) a planar shape, (ii) a cylindrical shape, (iii) a truncated conical shape, or (iv) a dome shape.

23. The reactor of claim 1, wherein the etch chamber has one of the following shapes: (i) a dome-shape, (ii) a cylindrical shape, or (iii) a truncated cone shape.

24. The reactor of claim 1, wherein the etch chamber has an aggregate shape constituting at least two of the following shapes: (i) a dome-shape, (ii) a cylindrical shape, or (iii) a truncated cone shape.

25. The reactor of claim 1, wherein the portion of the chamber walls not forming the protective layer comprise an electrically grounded conductive material.

26. The reactor of claim 25, wherein the electrically grounded conductive material comprises aluminum and the protective layer comprises aluminum oxide.

27. The reactor of claim 25, wherein the protective layer comprises a conductive ceramic material.

28. The reactor of claim 25, wherein the protective layer comprises boron carbide.

29. The reactor of claim 25, wherein the pedestal is connected to a source of RF power so as to create a bias voltage at the surface of the workpiece, said pedestal having an exterior surface area which is sufficiently smaller than that of the interior surface of the walls of the etch chamber so that the bias voltage has a maximum possible negative value.

30. The reactor of claim 25, wherein the conductive material exhibits a high degree of thermal conductivity, and wherein the walls of the etch chamber comprise cooling channels capable of sustaining a flow of coolant fluid therethrough so as to transfer heat from the interior of the chamber to the coolant fluid, said cooling channels being employed to maintain a prescribed temperature range within the chamber.

31. The reactor of claim 1, wherein the etchant gas injection apparatus comprises injection gas inlets disposed on the interior of the walls of the etch chamber, said inlets being located closely adjacent regions within the chamber exhibiting a relatively high power deposition.

32. The reactor of claim 1, wherein the inductive coil antenna comprises a conductive ceramic material.

33. The reactor of claim 1, wherein the inductive coil antenna comprises boron carbide.

34. The reactor of claim 1, wherein the inductive coil antenna comprises a core formed of a metal and an outer jacket formed of a conductive ceramic material.

35. The reactor of claim 34, wherein the conductive ceramic material comprises boron carbide.

36. The reactor of claim 1, wherein the inductive coil antenna has a tubular structure with a hollow interior, and wherein a channel formed by the hollow interior is capable of sustaining a flow of coolant fluid therethrough so as to maintain the antenna within a prescribed temperature range.

37. A plasma reactor comprising:
  a) a chamber having walls and adapted to process a workpiece within;
  b) a coil antenna disposed within the chamber capable of generating a plasma from a process gas; and
  c) the coil antenna comprising a non-sputtering conductive material and disposed within the chamber so that the non-sputtering conductive material is exposed to the plasma.

38. The plasma reactor of claim 37 wherein the coil antenna comprises a conductive ceramic material.

39. The plasma reactor of claim 38 wherein the coil antenna comprises boron carbide.

40. The plasma reactor of claim 37 wherein the coil antenna comprises a core formed of metal and an outer jacket formed of a conductive ceramic material.

41. The plasma reactor of claim 40 wherein the conductive ceramic material comprises boron carbide.

42. The plasma reactor of claim 37 wherein the chamber comprises conductive chamber walls.

43. The plasma reactor of claim 42 wherein the conductive chamber walls further comprise non-sputtering interior surfaces.

44. The plasma reactor of claim 43 wherein the coil antenna comprises a conductive ceramic material.

45. The plasma reactor of claim 37 wherein the chamber comprises a side wall, and wherein more than one turn of the coil antenna is disposed adjacent the side wall.

46. The plasma reactor of claim 45 wherein the coil antenna is non-conformal with the side wall.

47. The plasma reactor of claim 46 wherein the coil antenna comprises a conductive ceramic material.

48. The plasma reactor of claim 47 wherein the chamber comprises conductive chamber walls.

49. The plasma reactor of claim 48 wherein the conductive chamber walls further comprise non-sputtering interior surfaces.

* * * * *